United States Patent [19]

Bean et al.

[11] Patent Number: 4,554,045

[45] Date of Patent: Nov. 19, 1985

[54] METHOD FOR PRODUCING METAL SILICIDE-SILICON HETEROSTRUCTURES

[75] Inventors: John C. Bean, New Providence, N.J.; Kin-Chung R. Chiu, Mountain View, Calif.; John M. Poate, Summit, N.J.

[73] Assignee: AT&T Bell Laboratories, Murray Hill, N.J.

[21] Appl. No.: 445,014

[22] Filed: Nov. 29, 1982

Related U.S. Application Data

[62] Division of Ser. No. 156,649, Jun. 5, 1980, Pat. No. 4,492,971.

[51] Int. Cl.⁴ .............................................. C30B 25/14
[52] U.S. Cl. ......................... 156/613; 156/DIG. 100; 156/DIG. 102; 156/DIG. 103; 427/95
[58] Field of Search ... 156/610, DIG. 100, DIG. 102, 156/DIG. 103, 613; 357/4, 15; 427/91, 255.4, 427/93, 95

[56] References Cited

U.S. PATENT DOCUMENTS 3,927,225 12/1975 Cordes et al. ..................... 427/91 X
3,929,527 12/1975 Chang et al. ................... 156/610 X
4,180,596 12/1979 Crowder et al. ................. 427/42 X

OTHER PUBLICATIONS

Epitaxial Growth of Nickel Silicide $NiS_2$ on Silicon, Tu et al., Proc. 6th Internl. Vacuum Congr. 1974.

Primary Examiner—David L. Lacey
Attorney, Agent, or Firm—Eugen E. Pacher

[57] ABSTRACT

Described is a method for producing semiconductor heterostructures incorporating a metal layer. The metal layer, typically a metal-silicide, can be produced by, e.g., co-deposition or reaction with the substrate. The resulting silicide is typically epitaxial and of high crystalline perfection.

9 Claims, 3 Drawing Figures

METHOD FOR PRODUCING METAL SILICIDE-SILICON HETEROSTRUCTURES

This is a division of application Ser. No. 156,649, filed June 5, 1980, now U.S. Pat. No. 4,492,971.

BACKGROUND OF THE INVENTION

From the beginning of semiconductor device technology, physicists have postulated a host of semiconductor heterostructures, i.e., combinations of layers of different semiconductor materials in a single composite crystal. The fascination in this kind of structure is traceable to the nearly infinite selection of electrical properties thus potentially available to device designers. The early visions of a wide variety of hetero combinations were never realized. It is now recognized that semiconductor heterostructures with perfection suitable for state of the art devices are extermely difficult to produce. An approach that has proved successful, and is widely used, is that of combining III-V or II-VI semiconductors with ternary materials in the same system, e.g., GaAs and GaAlAs. Layers with slightly different amounts of the ternary addition can be graded to reduce the effect of the compositional discontinuity. Such structures are used widely in optoelectronic devices.

To date, all of the heterostructures that have met with technological success have been combinations of semiconductor materials.

SUMMARY OF THE INVENTION

We describe here a method for producing a true device-quality, semiconductor heterostructure incorporating a metal layer. We describe, a method for producing three layer semiconductor heterostructure and other multilayer structures incorporating a metal layer.

The following detailed description is framed around a silicon-metal silicide heterostructure. However, it should be appreciated at the outset that the structures and techniques described here are fundamental in many respects, and have potentially wide application to other material systems and to devices and uses other than those specifically indicated.

DETAILED DESCRIPTION

We describe here a new approach to the synthesis of compounds. It involves simultaneous compound formation and single crystal growth. Although the details that follow are described in connection with the formation of nickel silicide, we expect that other compound systems are thermodynamically and crystallographically suited to this synthesis technique. Therefore we present first a general description of the technique.

A feature of the technique is a vapor solid interaction between a single crystal solid of composition A and a vapor comprising B, at a temperature and pressure which favors a reaction of A with B to form a stoichiometric compound $A_xB_y$ and favors also formation of the compound as a single crystal. The designations are for convenience. A represents typically a metal or semiconductor but necessarily one having an essentially single crystal structure matching the structure of $A_xB_y$. B represents a material that is a vapor at the aforementioned temperature. We know of no existing technologically important process that meets this general description. However general it may be, we consider its application to metal silicide heterostructures to be especially significant. Accordingly the remainder of this disclosure will deal specifically with silicides. More particularly we present embodiments directed to nickel silicide and cobalt silicide as we believe that heterostructures incorporating those compounds offer promise for high quality device applications.

Figure 1:
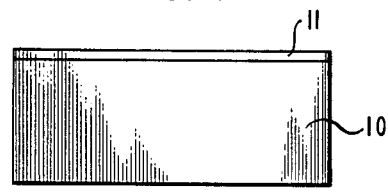
FIG. 1 is a schematic representation of an exemplary two-layer heterostructure.

FIG. 1 schematically represents a basic two-layer heterostructure made according to one aspect of the invention. It shows an essentially single crystal silicon substrate 10 with an overlying layer 11 of essentially single crystal metal silicide. We have succeeded in producing metal silicide layers with a crystal perfection unattainable by prior art methods.

We now describe the technique we used to form the metal silicide layers. It is our belief that an important aspect of this technique in terms of producing high quality material is the formation of the desired silicide compound directly. For clarity in exposition we describe the specific case of nickel silicide. Nickel and silicon form a number of compounds, $Ni_2Si$, $NiSi$, $NiSi_2$ of which only the silicon rich $NiSi_2$ phase has the requisite crystal structure to grow epitaxially on silicon. By depositing nickel on a heated, clean, crystallographically ordered silicon substrate, the first atoms are forced to immediately form the $NiSi_2$ phase. This occurs both because the first nickel atoms see an overabundance of Si and because the temperature is carefully adjusted for formation of the $NiSi_2$ phase. This process will not be reproduced if one heats a silicon/nickel layered structure, as the reaction proceeds by formation of $Ni_2Si$, followed by $NiSi$ with ultimate production of $NiSi_2$.

In order that the silicide form as a single crystal, according to one aspect of the invention, it is obviously desirable that the compound form in a crystal structure compatible with that of the original solid material and with appropriately matched lattice dimensions. Single crystal silicon forms in a cubic structure with a lattice constant of 5.43 Angstroms and nickel silicide forms a diamond lattice with a constant of 5.39. Cobalt silicide, ($CoSi_2$) with a lattice constant of 5.35, also matches well with silicon. While cobalt silicide and nickel silicide thus form a preferred category of materials within the scope of the invention we expect that similar results can be obtained with other silicide forming metals.

The specific procedure we used to demonstrate the formation of single crystal silicides is the following. Silicon substrates are first cleaned by ion sputtering and annealed within the vacuum apparatus leaving a pure ordered silicon surface. Substrates are then heated to 550–850 degrees C. at which point the substrates are exposed to a nickel evaporation source. This leads to the formation of a crystalline $NiSi_2$ layer the growth of which is terminated by closing the nickel source. The nickel silicide can also be grown by co-depositing nickel and silicon, preferably at approximately a 1 to 2 ratio.

The crystal morphology of silicide films prepared in the foregoing manner has been inferred from Rutherford backscattering and channeling techniques. In typical examples, temperature of deposition, deposition rate and silicon to nickel ratio were approximately 650 degrees C., approximately 1 Angstrom per second, and two to one respectively, in each case. The ratio of backscattering yield for the channeling direction to yield in a random direction is the well known measure of crystal perfection; $\chi_{min}$. The values obtained were 4.5% for the (111) substrate and 10% for the (100) substrate. These values are close to those expected in perfect single crystal. The latter value, 10%, represents a nominal figure of merit that is convenient to distinguish in terms of results the invention from other approaches.

We have found that deposition on the (111) silicon surface gives the most advantageous results. Growth on the (100) face appears to give excellent surface morphology, except that the Si-NiSi$_2$ interface demonstrates faceting unlike the (111) interface which appears atomically smooth.

Figure 2:
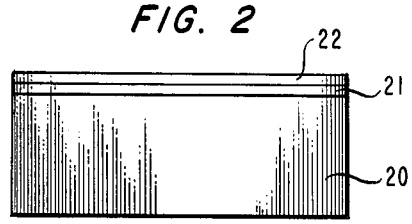
FIG. 2 is a schematic representation of a three-layer heterostructure.

With reference again to the drawing, the basic structure of FIG. 1 can be used to advantage in the heterostructure of FIG. 2. Here a silicon substrate 20 is shown with layer 21 of nickel silicide, covered with layer 22 of epitaxial silicon. In principle, layer 22 can be of any material capable of growing epitaxially on the metal silicide. However, the technologically interesting structure is silicon-metal silicide-silicon, in view of the applications soon to be described.

It is important in forming the epitaxial layer 22 that it also be deposited on a heated substrate, but for reasons other than those given earlier in connection with forming layer 21. By depositing Si on heated single crystal NiSi$_2$ the amorphous phase is avoided, and the Si atoms have sufficient surface mobility to immediately crystallize to from a single crystal layer.

It is known that metal silicide transport layers can be used in the formation of single crystal silicon by solid phase epitaxy. In this process silicon is deposited in an amorphous form on a metal or metal silicide coated slicon crystal. The layered structure is then heated. If the transport layer is initially metal, the first result of the heating step is the formation of a metal silicide transport layer. The next result of the heating step is the migration of silicon from the amphorous layer through the transport layer and the deposition of the transported silicon epitaxially on the single crystal silicon substrate. The significance of this prior art process in the context of this description is that the diffusion of amorphous silicon through a solid metal silicide layer overlying a silicon crystal cannot be avoided. This behavior is due to the amorphous Si having a higher free energy than single crystal Si. Thus, the amorphous silicon layer is metastable in the sense that, while heating the silicon to order it epitaxially, the layer disappears. Therefore attempts to form heterostructures by conventional techniques fail. These techniques are described in *Thin Films: Interdiffusion and Reaction*, J. Poate et al, John Wiley & Sons, 1978, pp. 433–468.

According to an aspect of this invention, single crystal silicon is formed in situ on the single crystal silicide layer. By this means we have been able to avoid transport of material back through the silicide layer, and have successfully formed three layer heterostructures with a high degree of crystal perfection. Such structures are capable of functioning in a variety of semiconductor devices.

It should also be recognized that the procedure for forming the epitaxial silicon is unique regardless of the procedure used to form the single crystal metal silicide.

An exemplary procedure for forming the structure represented by FIG. 1, and the structure represented in FIG. 2, will now be described.

The silicon substrate is chemically cleaned using the following sequence of chemical baths: acetone, methanol, $H_2O$, HF, $H_2O$, $NH_4OH:H_2O_2:H_2O$(Hot), $H_2O$, HF, $HCl:H_2O_2:H_2O$ (Hot), $H_2O$. This produces a clean silicon surface with a layer of $<10$ Angstroms of $SiO_2$. This substrate is then loaded into the vacuum deposition chamber and the apparatus pumped down to a vacuum of $<10^{-9}$ Torr. Separate silicon and nickel electron beam deposition sources are then turned on and the power adjusted so that the silicon deposition rate is approximately one monolayer per second at the substrate position. The nickel deposition rate is set for a value greater than one half monolayer per second. The silicon substrate is then cleaned in situ by bombardment with 1 kV argon ions for ten minutes at room temperature followed by a ten minute anneal at 850 degrees C. This produces an atomically clean, crystallographically ordered silicon substrate surface. The substrate is then cooled to 650 degrees C. Shutters in front of the silicon and nickel electron beam sources are then opened, initiating deposition of a crystalline NiSi$_2$ layer. At the desired thickness the shutter in front of the nickel source is closed.

Deposition of NiSi$_2$ therefore ceases and a silicon overlayer, typically a crystalline overlayer, continues to grow until the silicon source shutter is closed.

It should be understood that the foregoing procedure can be used to produce the double layer heterostructure of FIG. 1 by simply terminating the deposition after the nickel is deposited.

As indicated earlier, the temperature at which the nickel is deposited is important in order to form single crystal silicide material. The range of temperatures recommended is 550 to 850 degrees C. with temperatures in the range of 600 to 700 degrees C. preferred. Also important is the temperature of deposition of the silicon. Here a range of 550 to 750 degrees C. is recommended and temperatures of 600 to 700 degrees C. are preferred. Useful deposition temperatures using cobalt are similar except that due to greater stability of cobalt silicide processing temperatures can exceed those given for nickel by up to 200 degrees C. We have experienced success with deposition rates for the silicide of a few tenths to ten Angstroms per second, and we believe that rates from 0.1 to 100 Angstroms per second are useful. The deposition of silicon may be the same, or faster if desired, up to one hundred or several hundred Angstroms per second.

Figure 3:
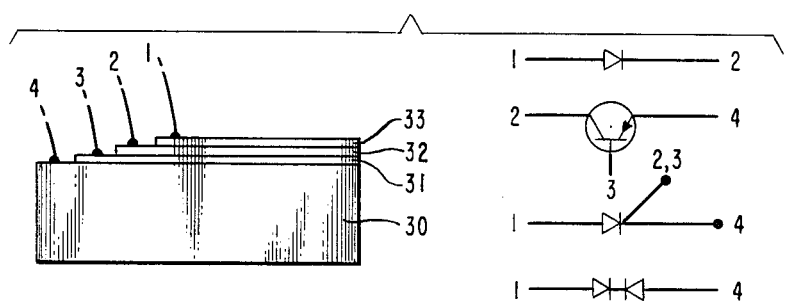
FIG. 3 is a schematic representation of a four-layer heterostructure which provides the option of building devices incorporating, as active electrical elements, all of the layers, or alternatively either a metal-semiconductor-metal heterostructure or a semiconductor-metal-semiconductor heterostructure.

Various device applications based on the subassembly shown in FIGS. 1 and 2 are described in the device embodiment of FIG. 3. FIG. 3 shows silicon substrate 30 covered with a silicide layer 31, a single crystal silicon layer 32, and another silicide layer 33, each with appropriate electrical contacts 1, 2, 3, and 4 as shown. Electrical functions implicit in this device structure are shown to the right of the figure. Simple Schottky diodes are available between contacts 1 and 2 or 3 and 4. Back-to-back diodes, with electrical functions similar to well known pnpn structures, result from interconnecting electrodes 1 and 4. A silicon controlled rectifier can be utilized in conventional manner via contacts 1, 4 and 2 or 3 alternatively. A three-layer transistor structure incorporates layers 2, 3, and 4.

Optical devices based on structures described herein may also find useful applications. By depositing alternating layers of silicide and silicon one could constitute a thin film interference filter. Such a device would take advantage of the high infrared transparency of the crystalline silicon layers interposed between the partially reflecting silicide layers.

Various additional modifications and extensions of this invention will become apparent to those skilled in the art. All such variations and deviations which basically rely on the teachings through which this invention has advanced the art are properly considered to be within the spirit and scope of this invention.

We claim:

1. A method for forming a silicon-metal silicide heterostructure comprising essentially monocrystalline silicide grown epitaxially on a single crystal silicon substrate, the method comprising:

exposing the substrate to a vapor comprising silicon and a silicide forming metal while heating the substrate to a temperature in the range of 550-850 degrees C., thereby reacting in situ the metal as it deposits and silicon to form a metal silicide essentially single crystal layer, leaving at least a portion of the substrate with said essentially single crystal metal silicide layer thereover.

2. The method of claim 1 including the additional step of epitaxially depositing silicon on the metal silicide layer while heating at least the surface of the metal silicide layer to a temperature in the range of 550-750 degrees C. thus forming a single crystal layer of silicon on the metal silicide layer.

3. The method of claim 1 or 2 in which the temperature is in the range of 600 to 700 degrees C.

4. The method of claim 1 or 2 in which the silicide forming metal is nickel or cobalt.

5. The method of claim 4 in which the silicide forming metal is nickel.

6. The method of claim 1 wherein the substrate is exposed to the vapor within a vacuum deposition chamber in which at least during part of the heterostructure-formation process a pressure of no more than about $10^{-9}$ Torr is maintained.

7. The method of claim 1, wherein the proportion of Si to silicide forming metal in the vapor is substantially 2 to 1.

8. A method for producing an article comprising an essentially monocrsytalline epitaxial layer consisting essentially of metal silicide, the layer overlying a single crystal substrate consisting essentially of silicon, the layer having $\chi_{min}$ no larger than 10%, where $\chi_{min}$ is the ratio of Rutherford backscattering yield for the channeling direction substantially normal to the layer to the yield in a random direction, the layer produced by a fabrication process comprising:

exposing the substrate to a vapor comprising silicon and a silicide forming metal while heating the substrate to a temperature in the range of 550-850 degrees C., thereby reacting in situ the metal and silicon to form said essentially monocrystalline layer.

9. The method of claim 8 wherein the silicide is nickel silicide or cobalt silicide.

* * * * *